United States Patent [19]
Fuse et al.

[11] Patent Number: 6,026,498
[45] Date of Patent: *Feb. 15, 2000

[54] CLOCK SIGNAL GENERATOR CIRCUIT USING A LOGICAL RESULT OF AN OUTPUT OF A COMPUTER AND A SOURCE CLOCK TO GENERATE PLURALITY OF CLOCK SIGNALS

[75] Inventors: Takeshi Fuse; Toshiyuki Igarashi; Masaaki Tani; Atsushi Fujita; Osamu Tago; Shigeo Koide, all of Kawasaki; Takashi Sugimoto, Kasugai, all of Japan

[73] Assignee: Fujitsu Limited, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/448,894

[22] Filed: May 24, 1995

[30] Foreign Application Priority Data

Aug. 10, 1994 [JP] Japan ...................................... 6-188343

[51] Int. Cl.⁷ ...................................................... G06F 13/00
[52] U.S. Cl. ............................ 713/600; 713/400; 713/500
[58] Field of Search ................................ 377/55; 340/904; 327/114, 62, 161; 375/354, 374; 370/509; 713/600, 400, 500

[56] References Cited

U.S. PATENT DOCUMENTS

| | | | |
|---|---|---|---|
| 4,100,540 | 7/1978 | Fujita et al. | 340/324 |
| 4,191,998 | 3/1980 | Carmody | 364/200 |
| 4,223,392 | 9/1980 | Lemaire et al. | 364/900 |
| 4,430,617 | 2/1984 | Kuhlmann | 327/114 |
| 4,463,440 | 7/1984 | Nishiura et al. | 364/900 |
| 4,475,085 | 10/1984 | Yahata et al. | 328/62 |
| 4,490,716 | 12/1984 | Tsuda et al. | 340/904 |
| 4,562,549 | 12/1985 | Tanaka et al. | 364/486 |
| 4,615,005 | 9/1986 | Maejima et al. | 395/560 |
| 4,805,195 | 2/1989 | Keegan | 375/354 |
| 4,979,194 | 12/1990 | Kawano | 377/55 |
| 5,003,196 | 3/1991 | Kawaguchi | 327/62 |
| 5,018,168 | 5/1991 | Matsuoka | 375/106 |
| 5,036,528 | 7/1991 | Costantino et al. | 375/374 |
| 5,051,990 | 9/1991 | Kato | 370/509 |
| 5,133,064 | 7/1992 | Hotta et al. | 395/550 |
| 5,179,693 | 1/1993 | Kitamura et al. | 395/550 |
| 5,359,232 | 10/1994 | Eitrheim et al. | 307/268 |
| 5,382,850 | 1/1995 | Aldrich et al. | 327/161 |
| 5,511,203 | 4/1996 | Wisor et al. | 395/750 |
| 5,561,792 | 10/1996 | Ganapathy | 395/550 |

*Primary Examiner*—Le Hien Luu
*Attorney, Agent, or Firm*—Nikaido, Marmelstein, Murray & Oram LLP

[57] ABSTRACT

A clock signal generator circuit has a clock generator for generating clock signals to be supplied to a central processing unit and to functional blocks, and clock selectors. The clock generator divides the frequency of a source clock signal, to form a clock signal having an optional period. Namely, the clock generator suppresses at least one active or inactive state of the source clock signal, to generate a clock signal whose period is an integer multiple of that of the source clock signal. The clock selectors receive the clock signals generated by the clock generator and selectively supply them to the CPU and functional blocks. The clock signal generator circuit is capable of operating a microcontroller system at a required minimum speed, to optimize the power consumption of the system.

12 Claims, 21 Drawing Sheets

| SEL1 | SEL0 | RATE |
|---|---|---|
| 0 | 0 | 1/1 |
| 0 | 1 | 1/2 |
| 1 | 0 | 1/4 |
| 1 | 1 | 1/8 |

(a) IDEAL SIGNAL (DUTY FACTOR OF 50%)
(b) DELAYED SIGNAL A
(c) OUTPUT OF LOW-LEVEL DETECTOR
(d) TRIGGER FOR CORRECTION
(e) CORRECTED SIGNAL
(f) ACTUAL WAVEFORM OF CORRECTED SIGNAL (a) IDEAL SIGNAL (DUTY FACTOR OF 50%)
(b) DELAYED SIGNAL A
(c) CORRECTED DUTY FACTOR
(d) ACTUAL WAVEFORM OF CORRECTED SIGNAL A (a) Vcc
(b) OUTPUT OF LOW-VOLTAGE DETECTOR
(c) RATE CHANGE INSTRUCTION SIGNAL (S1)
(d) SYSTEM CLOCK (CKS)

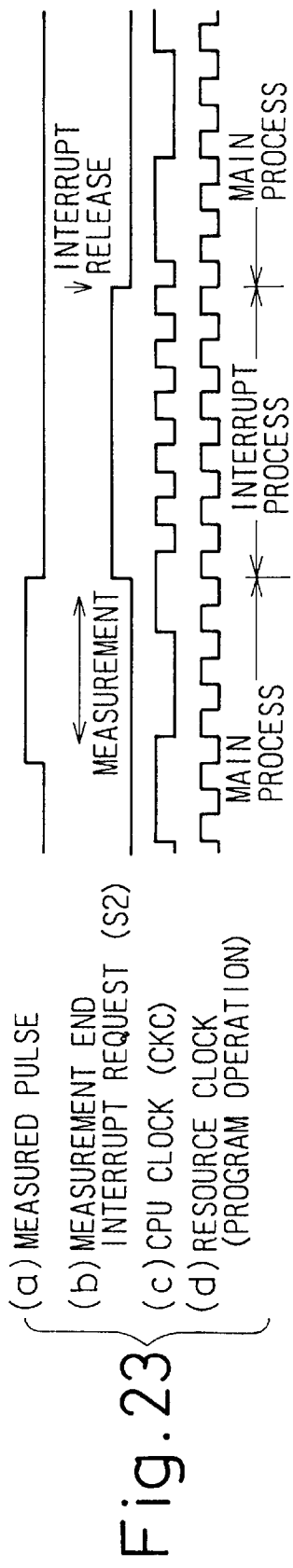

CLOCK SIGNAL GENERATOR CIRCUIT USING A LOGICAL RESULT OF AN OUTPUT OF A COMPUTER AND A SOURCE CLOCK TO GENERATE PLURALITY OF CLOCK SIGNALS

BACKGROUND OF THE INVENTION

1. Field of the Invention

The present invention relates to a microcontroller system, and particularly, to a clock signal generator circuit in a microcontroller system.

2. Description of the Related Art

The functions in portable equipment such as cameras, portable telephones, and notebook-type personal computers are becoming more diverse. Parts such as microcomputers and CPUs of these devices must be of high performance. The CPUs have changed from 4-bit or 8-bit types to 16-bit or 32-bit types. These high-performance CPUs involve a high processing speed, and therefore, consume a large amount of power. This causes a power problem in portable equipment driven by batteries. It is required to provide a technique for saving power.

The microcontroller system has a CPU (central processing unit), functional blocks, and a clock controller. The clock controller controls an external source clock signal CK, to provide the CPU and functional blocks with clock signals.

Generally, microcontroller systems, in particular, those for portable equipment have a power saving mode such as a standby mode or a sleep mode to save power. Note that, in the standby mode, the clock controller stops all the clock signals, and in the sleep mode, the clock controller stops the clock signal to the CPU.

The standby mode and the sleep mode effectively reduce power consumption because they stop the supply of clock signals. Completely stopping the functional blocks raises a problem in that a timer function, that must continuously monitor time, is also stopped.

To solve this problem, Japanese Unexamined Patent Publication (Kokai) No. 54-117649 has proposed a microcontroller system having a rate changing function.

A semiconductor circuit employing CMOS technology does not constantly consume power. Only when the elements thereof are switched in response to operation clock signals, does a current flow to them to consume power. Namely, power consumption in a CMOS circuit is proportional to the operation frequency.

Accordingly, a clock controller of the CMOS circuit having the rate changing function divides the frequency of a source clock signal by an integer, to provide a rate of, for example, 1/4 that has a period four times longer than the period of the source clock signal. This long-period clock signal is used to operate the elements of the circuit in a power saving mode, to reduce power consumption. Since the functional blocks of the circuit continuously operate even under the power saving mode, the problems of the standby mode and sleep mode never occur. When the CPU and functional blocks of the circuit are not required to operate at a high speed, the rate changing function is used to reduce power consumption.

The rate changing function divides the frequency of a source clock signal at a fixed rate and supplies the frequency divided signal to the CPU and functional blocks. This prior art is incapable of operating, for example, the CPU at a slower speed and a timer block at a faster speed. The prior art must set the frequency dividing rate according to a functional block that requires the fastest operation speed. This results in consuming large power. These problems in the prior art will be explained hereafter in detail with reference to the accompanying drawings.

SUMMARY OF THE INVENTION

An object of the present invention is to provide a technique of operating a microcontroller system at a required minimum speed to optimize power consumption.

According to the present invention, there is provided a clock signal generator circuit for generating and supplying clock signals to a central processing unit and functional blocks, comprising a clock generator for suppressing at least one active or inactive state of a source clock signal, to generate and provide a plurality of clock signals whose periods are integer multiples of a period of the source clock signal; and clock selectors each selecting one clock signal of the clock signals generated by the clock generator and supplying to at least one of the central processing unit and the functional blocks.

The period of the clock signal supplied to the central processing unit may be longer than those of the clock signals supplied to the functional blocks, to reduce power consumption.

Further, according to the present invention, there is provided a clock signal generator circuit for generating and supplying a clock signal to a central processing unit and functional blocks, comprising a correction unit for correcting a duty factor of the clock signal, to compensate for a delay in the clock signal due to load and secure an operation margin without decreasing a frequency of the clock signal.

The correction unit may include a duty factor detector for detecting the duty factor of the clock signal and a clock generator for correcting the duty factor of the clock signal according to an output of the duty factor detector. The correction unit may also include a duty factor setting register that is programmable to correct the duty factor of the clock signal.

In addition, according to the present invention, there is provided a microcontroller system comprising a central processing unit, functional blocks, and a clock generator for generating and supplying clock signals to the central processing unit and the functional blocks, wherein the clock generator suppresses at least one active or inactive state of a source clock signal, to optionally generate a plurality of clock signals whose periods are integer multiples of a period of the source clock signal, and supplying the generated clock signals to the central processing unit and the functional blocks.

According to the present invention, there is provided a semiconductor integrated circuit device having a central processing unit, functional blocks, and a clock generator for generating and supplying a plurality of clock signals to the central processing unit and the functional blocks, wherein the clock generator suppresses at least one active or inactive state of a source clock signal, to optionally generate clock signals whose periods are integer multiples of a period of the source clock signal, and supplying the generated clock signals to the central processing unit and the functional blocks.

The clock generator may optionally extend or shorten the active or inactive state of the source clock signal, to generate clock signals each having an optional period. The active or inactive state of the source clock signal may be changeable only at a specific clock period and is fixed at any other clock period.

Further, according to the present invention, there is also provided a semiconductor integrated circuit device comprising a central processing unit, functional blocks, and a clock generator for generating and supplying a plurality of clock signals to the central processing unit and the functional blocks, wherein the clock generator changes the periods of the clock signals without regard to the central processing unit.

The clock generator may automatically control the periods of the clock signals in response to an external request. The semiconductor integrated circuit device further comprises a voltage detector for providing a low- or high-voltage detected signal when a power source voltage is lower or higher than a predetermined value, and the clock generator automatically controls the periods of the clock signals upon receiving the detected signal.

BRIEF DESCRIPTION OF THE DRAWINGS

The present invention will be more clearly understood from the description of the preferred embodiments as set forth below with reference to the accompanying drawings, wherein:

FIG. 23 is a timing chart explaining the operation of the microcontroller system of FIG. 22.

DESCRIPTION OF THE PREFERRED EMBODIMENTS

For a better understanding of the preferred embodiments of the present invention, the problems in the prior art will be explained.

Figure 1:
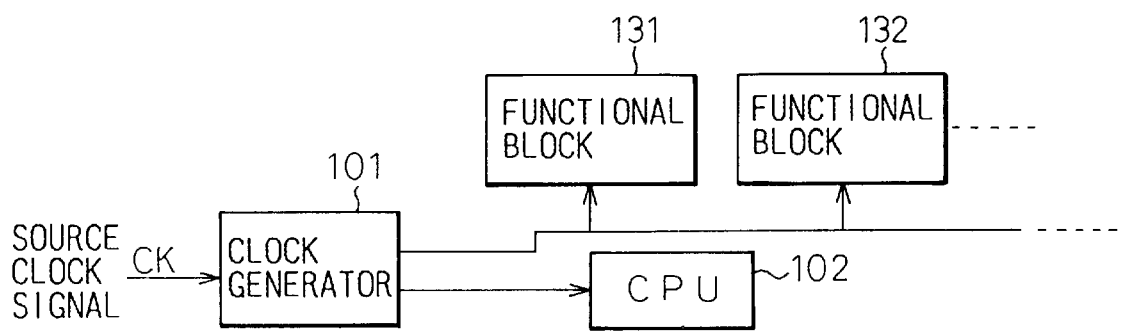
FIG. 1 is a block diagram showing a microcontroller system according to a prior art.

FIG. 1 is a block diagram showing a microcontroller system according to a prior art.

The microcontroller system has a CPU 102, functional blocks 131, 132, . . . , and a clock controller 101. The clock controller 101 controls an external source clock signal CK, to provide the CPU 102 and functional blocks 131 and 132 with clock signals.

Generally, microcontroller systems, in particular, those for portable equipment, have a power saving mode such as a standby mode or a sleep mode to save power. In the standby mode, the clock controller 101 stops all the clock signals. In the sleep mode, the clock controller 101 stops the clock signal to the CPU 102.

The standby mode and sleep mode effectively reduce power consumption because they stop the supply of clock signals. Completely stopping the functional blocks raises a problem in that a timer function that must continuously monitor time is also stopped.

To solve this problem, Japanese Unexamined Patent Publication No. 54-117649 has proposed a microcontroller system having a rate changing function.

A semiconductor circuit employing CMOS technology does not constantly consume power. Only when elements thereof are switched in response to operation clock signals, does a current flows to consume power. Namely, power consumption in a CMOS circuit is proportional to the operation frequency. Accordingly, a clock controller of the CMOS circuit having the rate changing function divides the frequency of a source clock signal by an integer, to provide a rate of, for example, 1/4 that provides a period four times longer than the period of the source clock signal. This long-period clock signal is used to operate the elements of the circuit in a power saving mode, to reduce power consumption. Since the functional blocks of the circuit continuously operate even in the power saving mode, the problems of the standby mode and sleep mode never occur. When the CPU and functional blocks of the circuit are not required to operate at a high speed, the rate changing function is used to reduce power consumption.

The rate changing function divides the frequency of a source clock signal at a fixed rate and supplies the frequency divided signal to the CPU and functional blocks. This prior art is incapable of operating, for example, the CPU at a slower speed and a timer block at a faster speed. The prior art must set the frequency dividing rate according to a functional block that requires the fastest operation speed. This results in a high power consumption.

Figure 2:
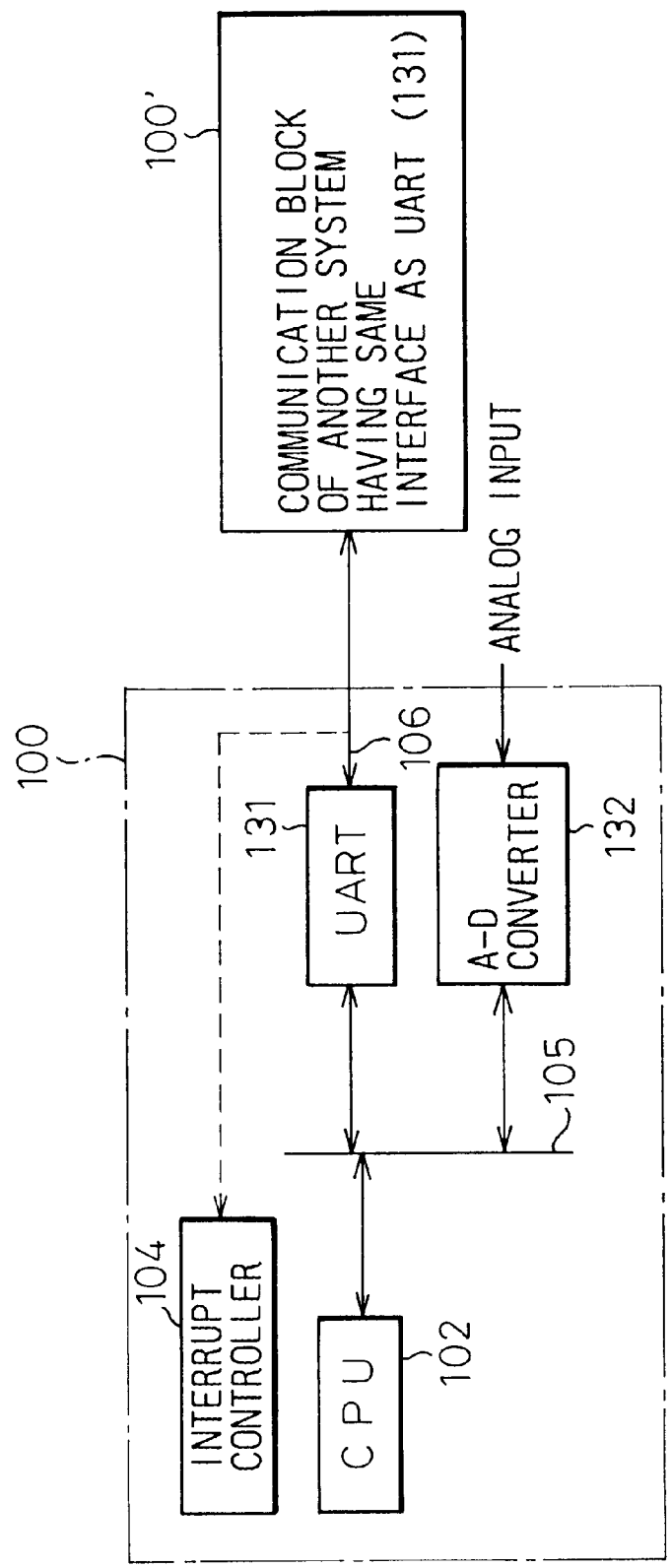
FIG. 2 is a block diagram explaining the problems of the microcontroller system of the prior art.

FIG. 2 is a block diagram explaining the problem of the prior art.

A microcontroller system 100 has a CPU 102, a UART (universal asynchronous receiver transmitter) 131, an A-D converter 132, and an interrupt controller 104.

The CPU 102, UART 131, and A-D converter 132 are connected to one another through a synchronous bus 105. The UART 131 and A-D converter 132 are functional blocks or modules. Input data 106 to the UART 131 is connected to the interrupt controller 104 of the CPU 102.

The UART 131 generally controls serial data asynchronously transmitted to and from a communication block 100' having the same interface as the UART 131. According to an asynchronous method or a start-stop bit method, each piece of transmission data consists of one start bit, five to eight data bits, one parity bit, and one, one and half, or two stop bits. The UART 131 removes the start and stop bits, selects and controls the number of the data and stop bits, creates and detects a break sequence, and detects an overrun on a framing error.

The UART 131 must operate at a given baud rate because it carries out asynchronous communication with other systems. Namely, the communication rate of the UART 131 must not be reduced by the rate changing function. If the A-D converter 132 is provided with a sample hold circuit, the A-D converter 132 must complete a conversion process within a predetermined period because the sample hold circuit usually has no refresh function. Accordingly, when the A-D converter 132 has a sample hold circuit, it is not possible to divide the frequency of a source clock signal by a large divisor.

This problem may be solved by supplying clock signals having different periods to the CPU and functional blocks. However, the synchronous bus will cause a malfunction if the CPU and functional blocks are operated at different speeds.

The microcontroller system employing the rate changing function changes a rate by software. When a communication start level "0" is provided as the input 106 to the UART 131 of the microcontroller system 100 operating at a low rate, the interrupt controller 104 also receives the input 106 and the CPU 102 starts an interrupt routine to let the UART 131 receive data at a normal rate. Here, a problem is an interval between the reception of the communication start level "0" and the time when the CPU 102 changes the rate in the interrupt routine. If the presently used rate is very low, it takes a long time to change the rate, transmitted data is lost and an asynchronous operation is not achieved.

Figure 3:
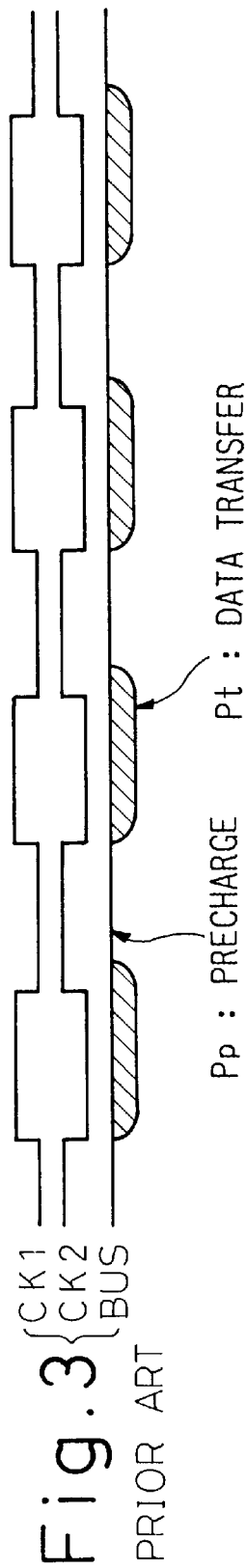
FIG. 3 is a timing chart explaining a still another problem of microcontroller system of the prior art.

FIG. 3 is a timing chart explaining a still another problem of the prior art. The figure shows a general precharge (dynamic) bus used by the microcontroller of the prior art to transfer data. The reference mark Pp indicates a precharge state of the bus, and Pt indicates a data transfer state thereof.

The precharge bus requires a clock signal of a transmitter to be equal to a clock signal of a receiver. This is because the effective duration of transmission data is limited. Usually, the duration of the precharge state Pp is half a signal cycle. If no synchronization is established, it is necessary to provide additional hardware to serve as a data synchronization interface.

Now, preferred embodiments of the present invention will be explained with reference to the drawings.

Figure 4:
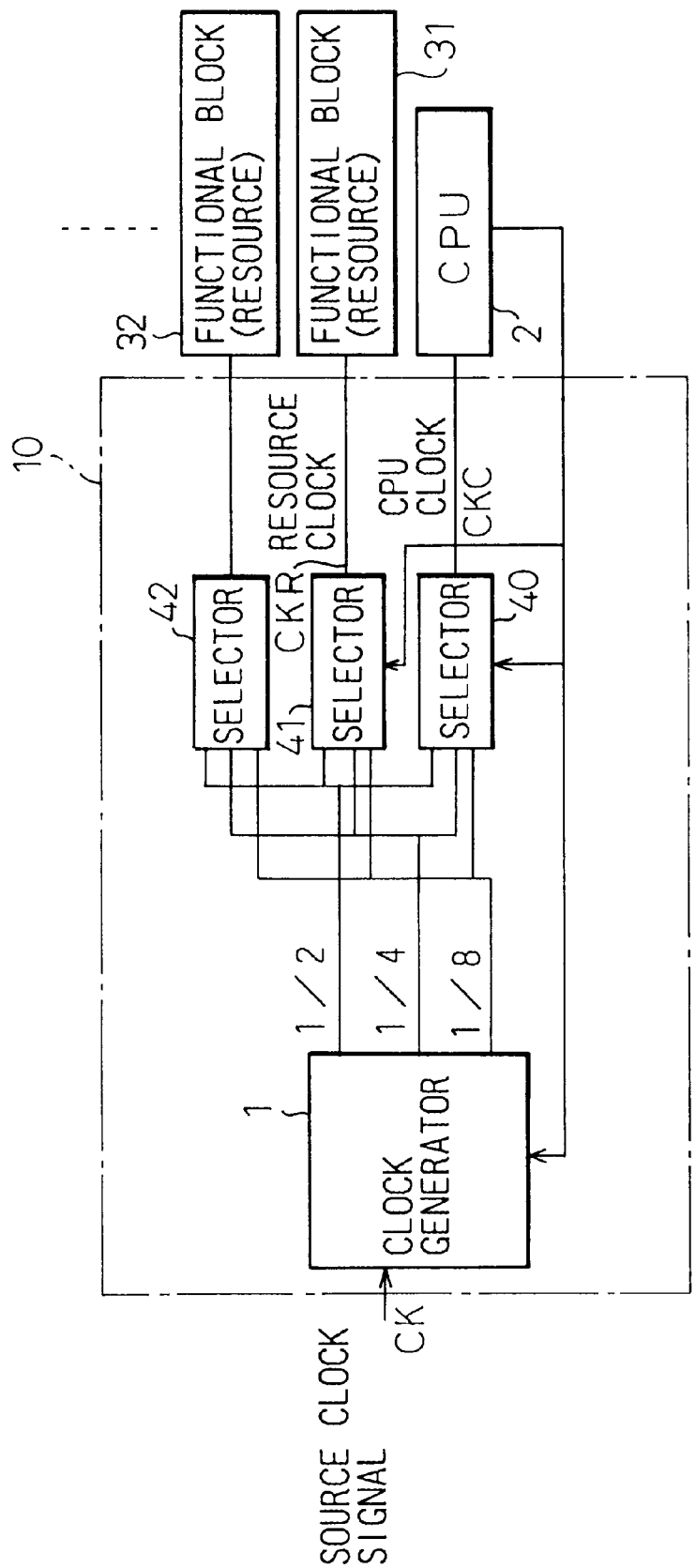
FIG. 4 is a block diagram showing a microcontroller system according to a first embodiment of the present invention.

FIG. 4 is a block diagram showing a microcontroller system according to the first embodiment of the present invention. This system has a clock signal generator circuit 10, a CPU 2, and functional blocks (modules) 31, 32, and so on. For example, the functional block 31 is a UART, and the functional block 32 is an A-D converter.

The clock signal generator circuit 10 has a clock generator 1 and selectors 40 to 42 corresponding to the CPU 2 and functional blocks 31 and 32, respectively. The clock generator 1 is controlled by the CPU 2 and divides the frequency of a source clock signal CK, to generate clock signals of rates of 1/2, 1/4, and 1/8, respectively. The clock signals are supplied to the selectors 40 to 42, which select the signals according to instructions from the CPU 2 and supply them to the CPU 2 and functional blocks 31 and 32, respectively. This embodiment automatically activates a rate changing mode in response to an internal or external factor. Although FIG. 4 shows two functional blocks 31 and 32, the number of the functional blocks may be increased, if required. In this case, the number of the selectors must be increased accordingly.

Figure 5:
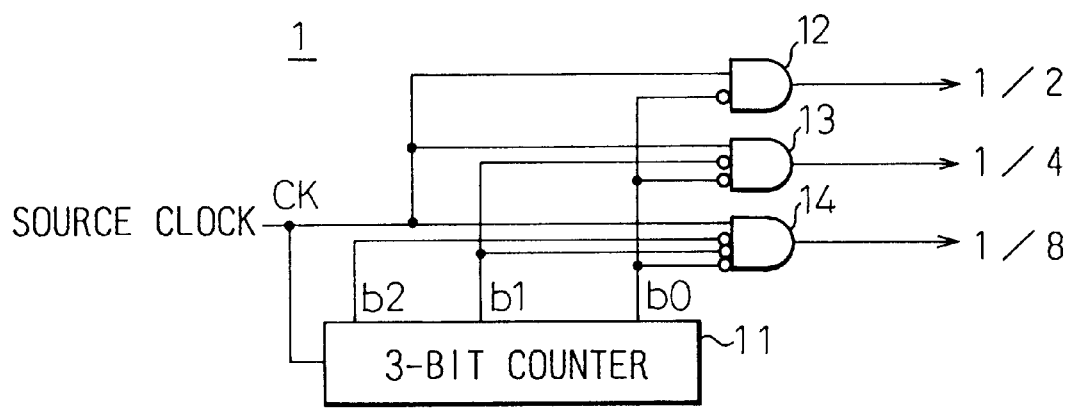
FIG. 5 is a block diagram showing a clock generator of the microcontroller system of FIG. 4.
Figure 6:
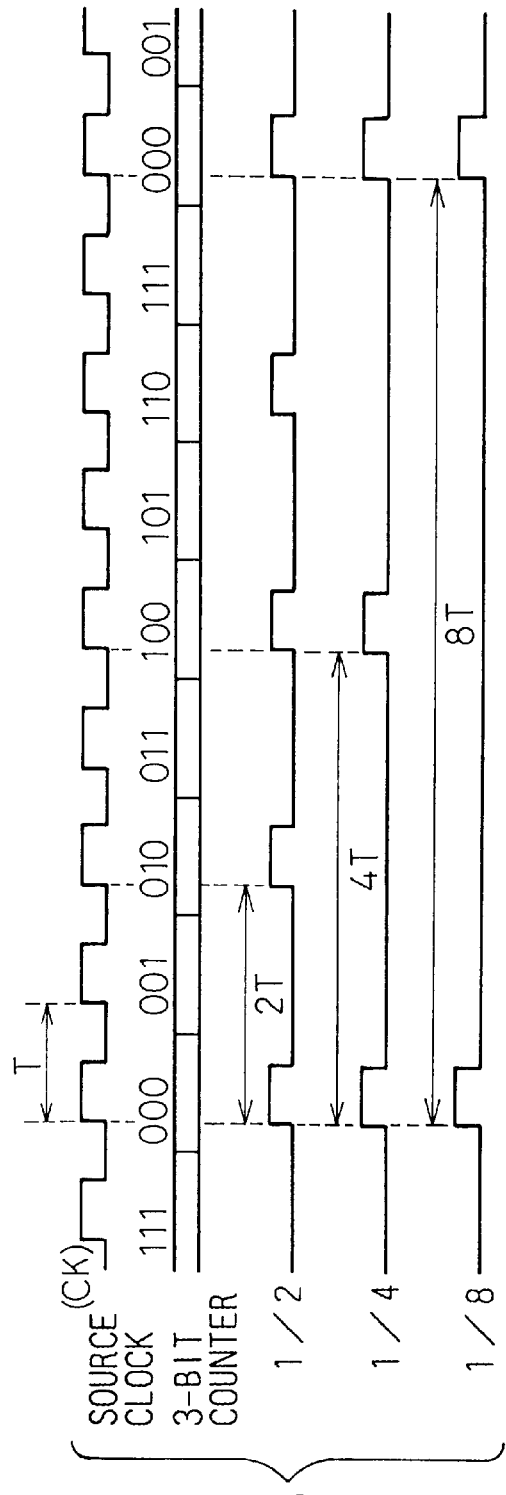
FIG. 6 is a timing chart showing signals in the clock generator of FIG. 5.

FIG. 5 is a block diagram showing the clock generator 1 of the microcontroller system of FIG. 4. FIG. 6 is a timing chart showing signals in the clock generator 1 of FIG. 5.

In FIG. 5, the clock generator 1 has a 3-bit counter 11 for counting pulses of a source clock signal CK and three logic gates (AND gates) 12 to 14. The AND gates 12 to 14 have each a first input terminal for receiving the source clock signal CK. The AND gate 12 has an inverted second input terminal for receiving the output b0 of the 3-bit counter 11. The AND gate 13 has inverted second and third input terminals for receiving the outputs b0 and b1 of the 3-bit counter 11, respectively. The AND gate 14 has inverted second to fourth input terminals for receiving the outputs b0, b1, and b2 of the 3-bit counter 11, respectively.

In FIG. 6, the AND gate 12 provides a clock signal of a rate of 1/2 whose period is 2T, that is, two times longer than the period T of the source clock signal CK. The AND gate 13 provides a clock signal of a rate of 1/4 whose period is 4T, that is, four times longer than the period T. The AND gate 14 provides a clock signal of a rate of 1/8 whose period is 8T, that is, eight times longer than the period T.

Figure 7:
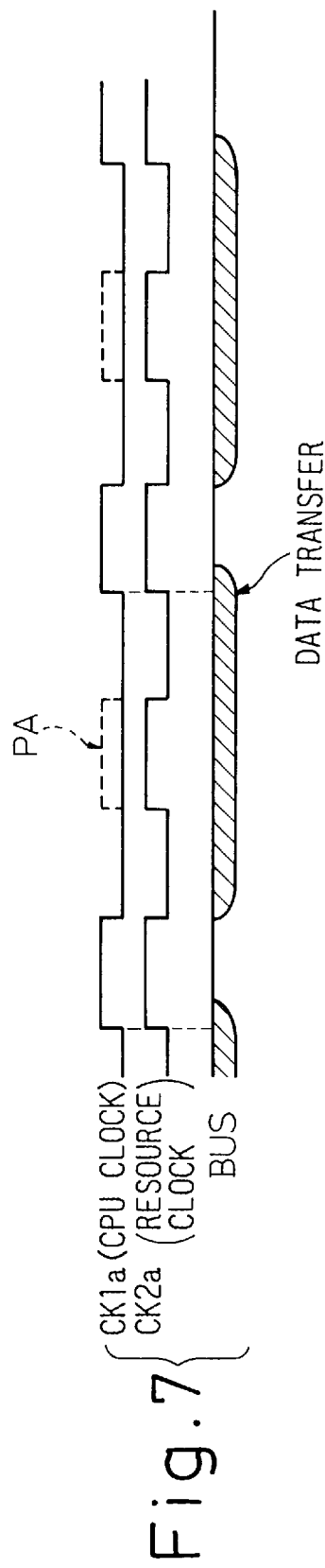
FIG. 7 is a timing chart showing clock signals in the microcontroller system of FIG. 4.

FIG. 7 is a timing chart showing clock signals in the microcomputer system of FIG. 4.

A clock signal CKC is supplied to the CPU 2, and a clock signal CKR is supplied to the function block 31. The clock signals CKC and CKR are independent of each other. The CPU clock CKC is generated by removing active parts PA from the source clock signal CK. Namely, the clock generator 1 suppresses every second active state of the source clock signal CK, to generate a CPU clock signal CKC whose period is as twice long as the period of the source clock signal CK.

Although the clock generator 1 of the above example generates a clock signal whose period is twice as long as that of the source clock signal and supplies the longer signal to the CPU 2, the present invention is not limited to this. The clock generator 1 may optionally other suppress active or inactive states of the source clock signal, to generate a clock signal whose period is an integer multiple of the period of the source clock signal. The created clock signal is supplied to the CPU or to other functional blocks.

The periods of clock signals supplied to the CPU 2 and functional blocks 31 and 32 may be independent of one another. To achieve this, a frequency multiplier such as a PLL (phase locked loop) circuit is employed. This circuit is capable of operating a given module at a very high speed. In this case, it is necessary to change the high- and low-level periods of a clock signal according to a critical path. By changing the duty factor of a clock signal, it is possible to operate a given module at the highest speed.

Figure 8:
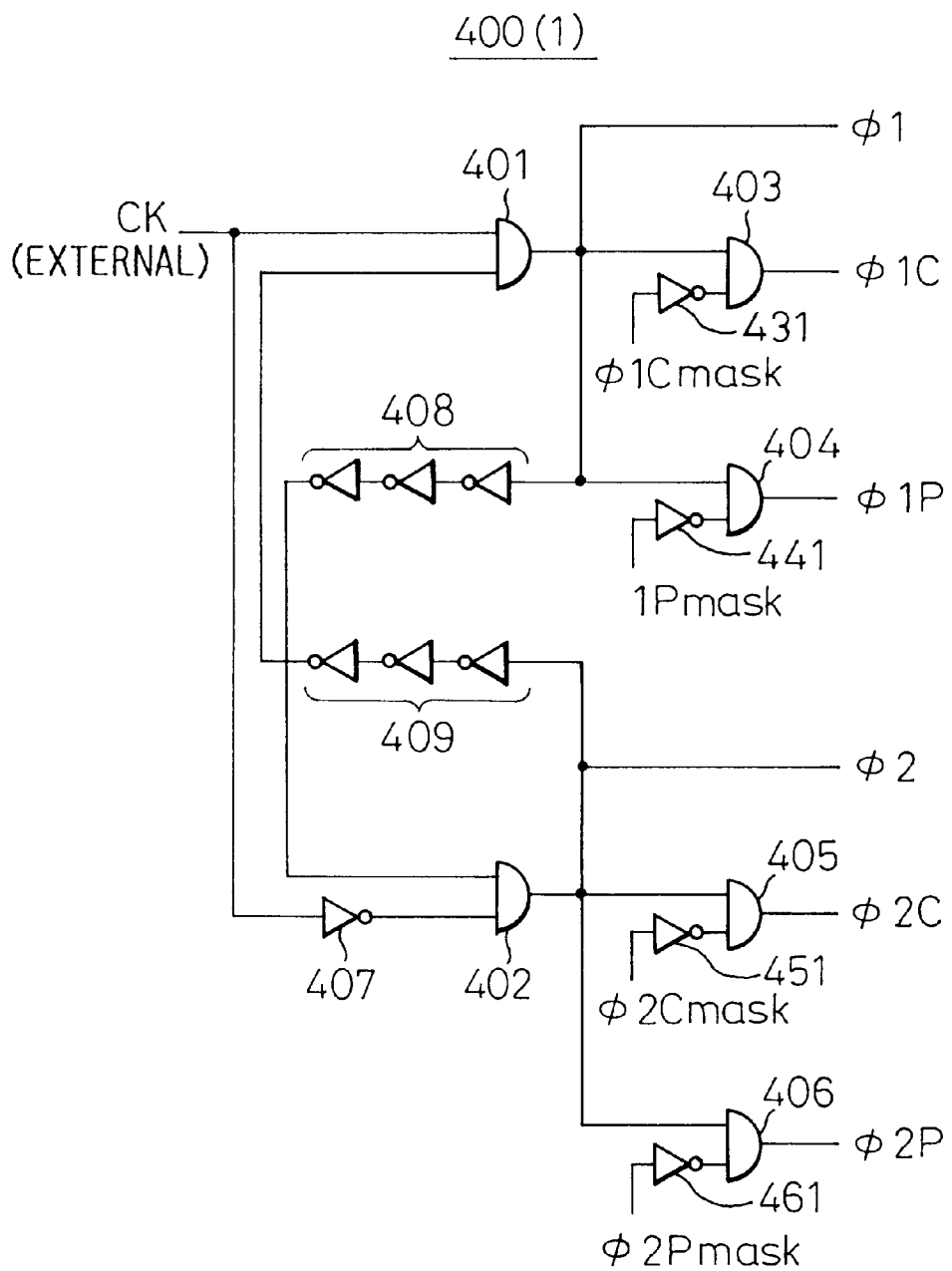
FIG. 8 is a circuit diagram showing a clock signal generator circuit according to an embodiment of the present invention.

FIG. 8 is a circuit diagram showing a clock signal generator circuit according to an embodiment of the present invention. This circuit generates clock signals with two phases. The clock signal generator circuit 400 has AND gates 401 to 406, inverters 407, 431, 441, 451, and 461, and delay units 408 and 409. A clock signal CK is externally supplied to an input terminal of the AND gate 401 directly and to an input terminal of the AND gate 402 through the inverter 407. The other input terminal of the AND gate 401 receives an output signal $\phi 2$ from the AND gate 402 through the delay unit 409. The other input terminal of the AND gate 402 receives an output signal $\phi 1$ from the AND gate 401 through the delay unit 408. The signal $\phi 1$ is supplied to the input terminals of the AND gates 403 and 404. The signal $\phi 2$ is supplied to the input terminals of the AND gates 405 and 406.

The other input terminal of the AND gate 403 receives a mask signal $\phi 1$Cmask for a CPU clock signal through the inverter 431. The other input terminal of the AND gate 404 receives a mask signal $\phi 1$Pmask for functional blocks through the inverter 441. The other input terminal of the AND gate 405 receives a mask signal $\phi 2$Cmask for a CPU clock signal through the inverter 451. The other input terminal of the AND gate 406 receives a mask signal $\phi 2$Pmask for the functional blocks through the inverter 461. The AND gates 403 and 405 provide CPU clock signals $\phi 1$C and $\phi 2$C of two phases, respectively. The AND gates 404 and 406 provide resource clock signals $\phi 1$P and $\phi 2$P of two phases, respectively.

Figure 9:
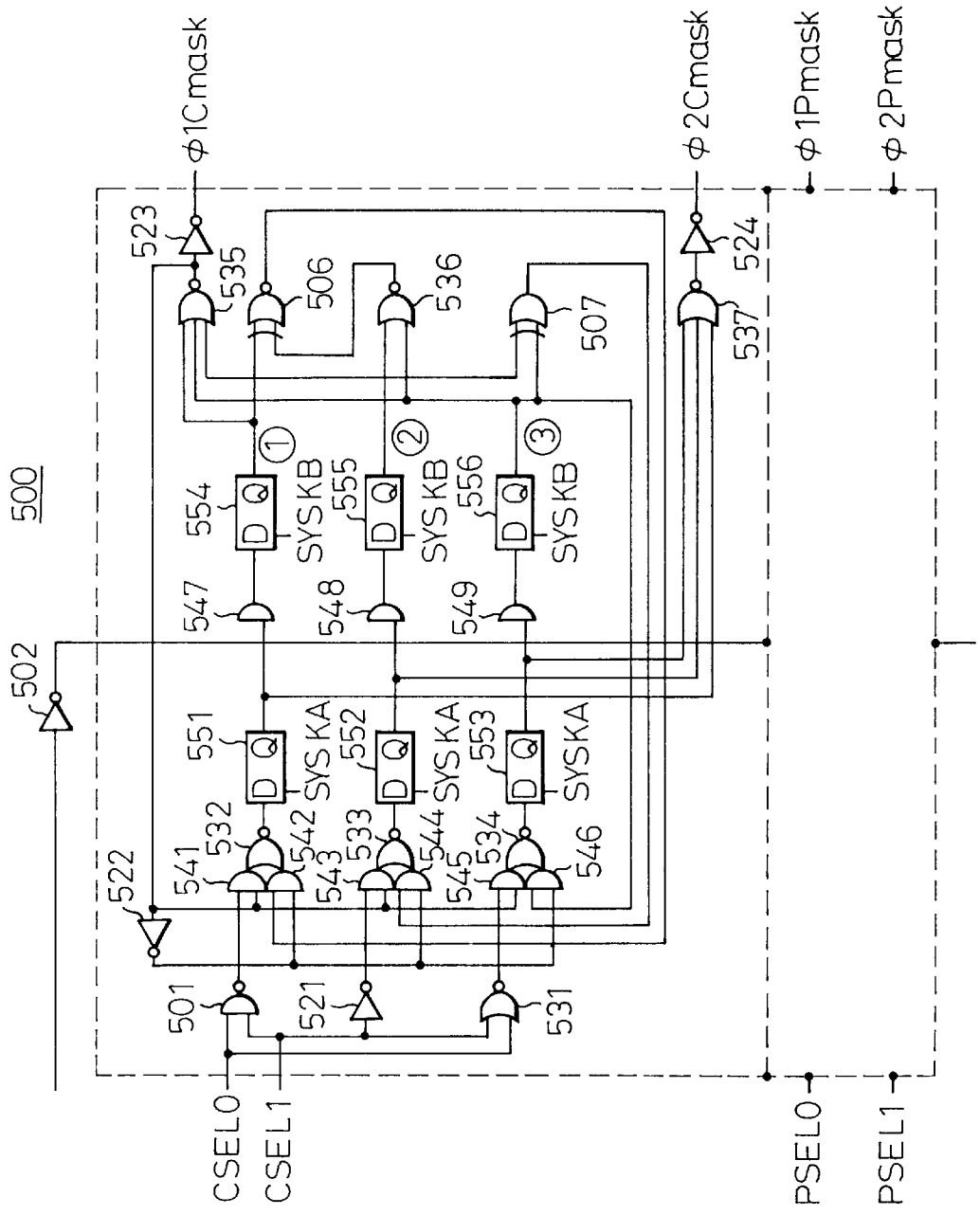
FIG. 9 is a circuit diagram showing a mask signal generator in the clock signal generator circuit of FIG. 8.

FIG. 9 is a circuit diagram showing a mask signal generator for generating a mask signal in the clock signal generator circuit of FIG. 8.

The mask signal generator 500 has a NAND gate 501, inverters 502 and 521 to 524, NOR gates 531 to 537, AND gates 541 to 549, flip-flop circuits 551 to 556, an ENOR gate 506, and an EOR gate 507. The flip-flop circuits 554, 555, and 556 provide outputs (1), (2), and (3), respectively. The NAND gate 501 and NOR gate 531 receive CPU clock select signals CSEL0 and CSEL1. The select signal CSEL1 is also supplied to the inverter 521. The inverter 523 provides the CPU clock mask signal $\phi 1$Cmask. The inverter 524 provides the CPU clock mask signal $\phi 2$Cmask. Depending on the levels of the select signals CSEL0 and CSEL1, one of the mask signals $\phi 1$Cmask and $\phi 2$Cmask is selected. The same circuit is arranged for the resource clock signal. Depending on the levels of select signals PSEL0 and PSEL1 for the resource clock signal, one of the resource clock mask signals 1Pmask and 2Pmask is selected.

Figures 10, 11:
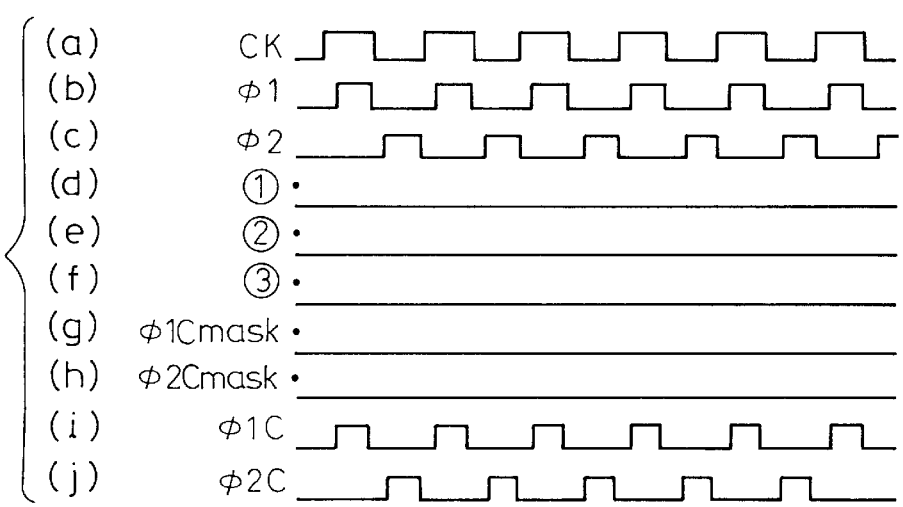
FIG. 10 shows relationships between control signals and rates in the mask signal generator of FIG. 9.
FIG. 11 is a timing chart showing control signals and their levels in the clock signal generator circuit of FIG. 8.

FIG. 10 shows relationships between the select signals and rates in the mask signal generator of FIG. 9. Depending on the levels of the CPU clock select signals CSEL0 and CSEL1 and those of the source clock select signals PSEL0 and PSEL1, a corresponding rate is selected.

More precisely, a rate of 1/1 is selected with CSEL0=0 and CSEL1=0. A rate of 1/4 is selected with CSEL0=0 and CSEL1=1.

FIG. 11 is a timing chart showing the relationships between the select signals and their levels in the clock signal generator of FIG. 8 with CSEL0=0 and CSEL1=0.

When CSEL0=0 and CSEL1=0, the outputs (1), (2), and (3) of the flip-flop circuits 554, 555, and 556 of FIG. 9 are each at low level as indicated with (d), (e), and (f) of FIG. 11. The CPU clock mask signals $\phi 1$Cmask and $\phi 2$Cmask are each at low level as indicated with (g) and (h) of FIG. 11. As a result, the CPU clock signals $\phi 1$C and $\phi 2$C have the same waveforms as the outputs $\phi 1$ and $\phi 2$ of the AND gates 401 and 402, to select the rate of 1/1.

Figure 12:
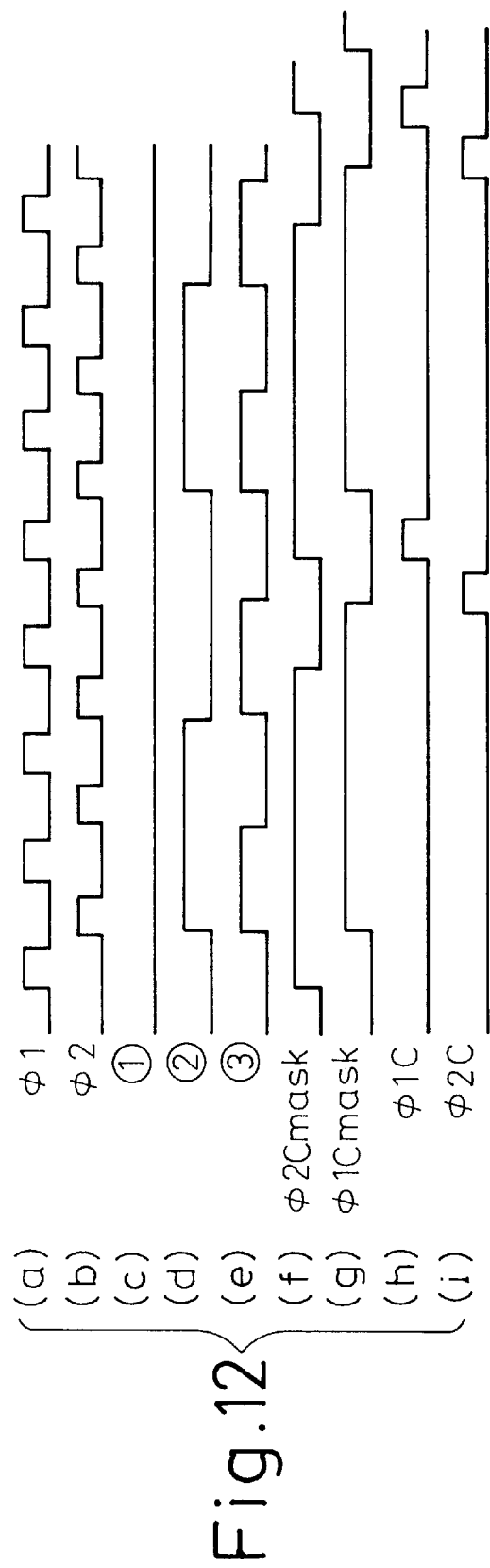
FIG. 12 is a timing chart showing control signals and their levels in the clock signal generator circuit of FIG. 8.

FIG. 12 is a timing chart showing relationships between the select signals and their levels in the clock signal generator of FIG. 8 with CSEL0=0 and CSEL1=1.

When CSEL0=0 and CSEL1=1, the outputs (1), (2), and (3) of the flip-flop circuits 554, 555, and 556 are as indicated with (c), (d), and (e) of FIG. 12. The CPU clock mask signals $\phi 1$Cmask and $\phi 2$Cmask are as indicated with (f) and (g) of FIG. 12. These mask signals $\phi 1$Cmask and $\phi 2$Cmask are supplied to the inputs of the AND gates 403 and 405 through the inverters 431 and 451. Then, the AND gates 403 and 405 provide the CPU clock signals $\phi 1$C and $\phi 2$C whose period is four times longer than that of the source clock signal CK, as indicated with (h) and (i) of FIG. 12.

The above explanations for the CPU clock select signals CSEL0 and CSEL1, CPU clock mask signals $\phi 1$Cmask and $\phi 2$Cmask, and CPU clock signals $\phi 1$C and $\phi 2$C are applicable to the resource clock select signals PSEL0 and PSEL1, resource clock mask signals $\phi 1$Pmask and $\phi 2$Pmask, and resource clock signals $\phi 1$P and $\phi 2$P.

As explained above, the clock signal generator circuit and microcontroller system of the present invention are capable of setting the operation frequencies of function blocks (resources), respectively, to operate the microcontroller system at a required minimum speed and optimize power consumption. The present invention is also capable of sending clock signals with various periods to function blocks connected to a precharge bus.

The present invention is also capable of supplying clock signals according to a critical path, to operate functional blocks at respective maximum speeds. In this case, the present invention secures a maximum margin in an operation frequency even when the functional blocks are operated at a low voltage.

The present invention is able to quickly change a rate (an operation speed) in response to an external or hardware request, to thereby improve the response speed of a system even when the CPU is operating at a slow rate.

Figure 13:
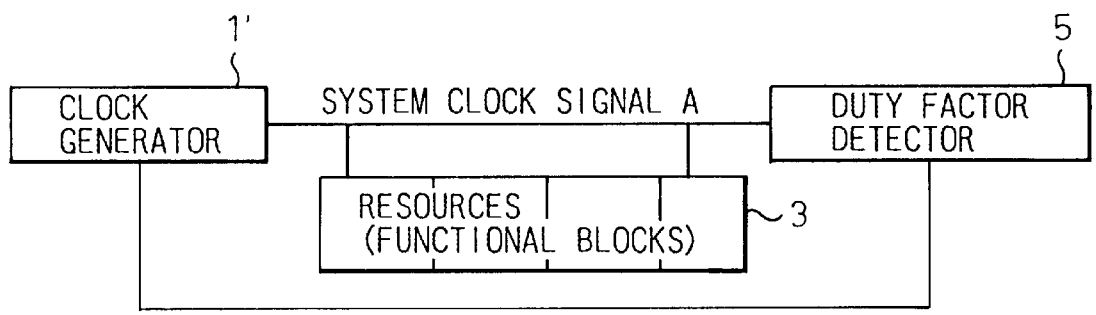
FIG. 13 is a block diagram showing a microcontroller system according to a second embodiment of the present invention.

FIG. 13 is a block diagram showing a microcontroller system according to the second embodiment of the present invention. This system has a clock generator 1', resources (functional blocks) 3, and a duty factor detector 5.

The clock generator 1' provides the resources 3 with a system clock signal A. The system clock signal A is also supplied to the duty factor detector 5, which detects the duty factor of the system clock signal A. The detected duty factor is fed back to the clock generator 1', to change the duty factor of the clock generator 1'. When the waveform of the system clock signal A is distorted due to load on the circuit, the duty factor of the system clock signal A is changed to correctly operate the circuit with a sufficient operation margin without decreasing the frequency of the system clock signal A. To change the duty factor of the system clock signal A, the embodiment divides the frequency of a source clock signal, using a timer, depending on the scale of the circuit.

Figure 14:
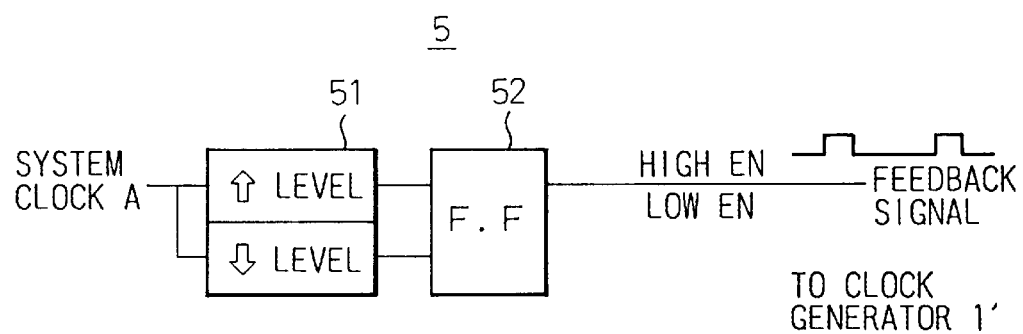
FIG. 14 is a block diagram showing a duty factor detector in the microcontroller system of FIG. 13.

FIG. 14 is a block diagram showing the duty factor detector 5 of the microcontroller system of FIG. 13. The duty factor detector 5 has an H/L detector 51 and a flip-flop circuit 52.

The H/L detector 51 receives the system clock signal A, determines whether the level of the system clock signal A is high or low, and provides a clock switching trigger. The flip-flop circuit 52 receives the clock switching trigger and generates a high- or low-level clock gate signal.

Figure 15:
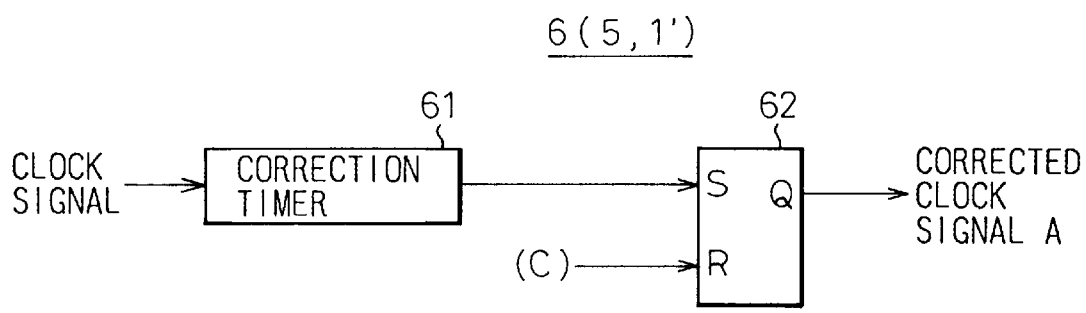
FIG. 15 is a block diagram showing an essential part of the microcontroller system of FIG. 13.

FIG. 15 is a block diagram showing an essential part of the microcontroller system of FIG. 13. Numeral 6 represents a controller for controlling the duty factor detector 5 and clock generator 1'.

The controller 6 has a correction timer 61 and an RS flip-flop circuit 62.

The correction timer 61 receives an oscillated clock signal. An overflow output from the correction timer 61 is supplied to a set terminal S of the R-S flip-flop circuit 62. A reset terminal R of the flip-flop circuit 62 receives an output from a low-level detector shown in FIG. 16(c). The low-level detector corresponds to the H/L detector 51 of FIG. 14. An output terminal Q of the flip-flop circuit 62 provides a corrected system clock signal A as indicated with (e) and (f) in FIG. 16.

Figure 16:
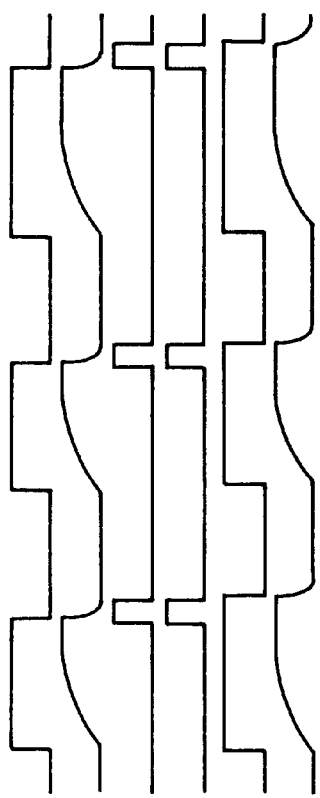
FIG. 16 is a timing chart explaining the operation of FIG. 15.

FIG. 16 is a timing chart explaining the operation of the circuit of FIG. 15.

FIG. 16(a) shows a system clock signal A with an ideal duty factor of 50%. Load on the circuit distorts this ideal waveform into the one shown in FIG. 16(b). The waveform of FIG. 16(b) involves a short high-level period or a short low-level period, to insufficiently provide an operation margin. To solve this problem, the prior art decreases the frequency of the system clock signal until it secures a sufficient operation margin. This measure never satisfies the requirement for high-speed operation.

The duty factor controller 6 of FIG. 15 changes the ideal waveform of the system clock signal A of FIG. 16(a) into one shown in FIG. 16(e) or 16(f), to secure a sufficient operation margin even under load on the circuit. To realize this, the output shown in FIG. 16(c) of the H/L detector 51 (low-level detector) of FIG. 14 is used as a trigger of FIG. 16(d) to correct the system clock signal A. As a result, the circuit of FIG. 15 provides the corrected system clock signal A. FIG. 16(e) shows an ideal waveform of the corrected system clock signal A, and FIG. 16(f) shows an actual waveform of the same due to load on the circuit.

Figure 17:
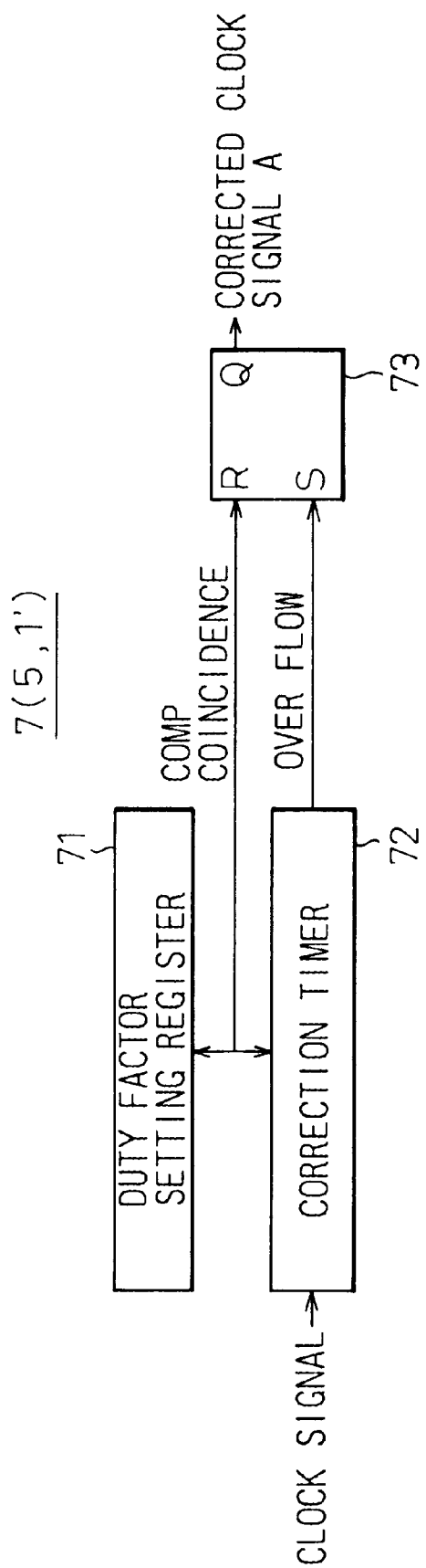
FIG. 17 is a block diagram showing an essential part of the microcontroller system of FIG. 13.

FIG. 17 shows an essential part of the microcontroller system of FIG. 13. The embodiment of FIGS. 17 and 18 is programmable to correct the duty factor of the system clock signal A.

In FIG. 17, the duty factor controller 7 has a duty factor setting register 71, a correction timer 72, and an R-S flip-flop circuit 73.

The register 71 is used to store a duty factor of the system clock signal A in advance according to the scale of the circuit and the measurement of a delay in a clock signal due to load. The correction timer 72 corrects the duty factor of the system clock signal A. A coincident output from the register 71 and timer 72 is supplied to a reset terminal R of the flip-flop circuit 73, and an overflow output from the timer 72 is supplied to a set terminal S of the flip-flop circuit 73. An output terminal Q of the flip-flop circuit 73 provides a corrected system clock signal A shown in FIGS. 18(c) and 18(d).

Figure 18:
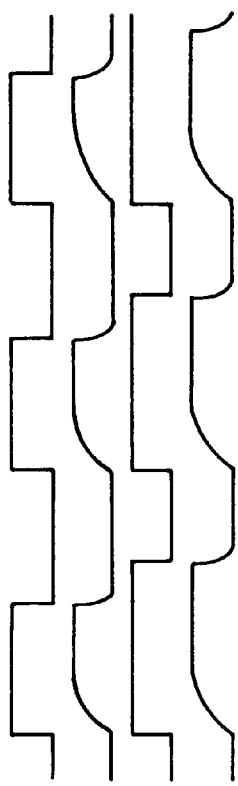
FIG. 18 is a timing chart showing the operation of FIG. 17.

FIG. 18 is a timing chart explaining the operation of the circuit of FIG. 17.

FIG. 18(a) shows an ideal waveform of the system clock signal A with a duty factor of 50%. This ideal waveform is distorted into one shown in FIG. 18(b) due to a load on the circuit. Namely, a high- or low-level period of the signal is shortened to insufficiently provide an operation margin of the circuit. To solve this problem, the prior art decreases the frequency of the system clock signal until it secures a sufficient operation margin. This method never meets the requirement for high-speed operation.

The duty factor controller 7 of FIG. 17 corrects the waveform of the distorted signal of FIG. 18(b) to the one shown in FIG. 18(d), to secure a sufficient operation margin, even under load, in the circuit. Namely, this embodiment corrects the ideal waveform of the system clock signal A into one shown in FIG. 18(c), to secure a sufficient operation margin to carry out a correct operation, even under load. The ideal waveform of FIG. 18(c) will actually be the one shown in FIG. 18(d) due to load.

Figure 19:
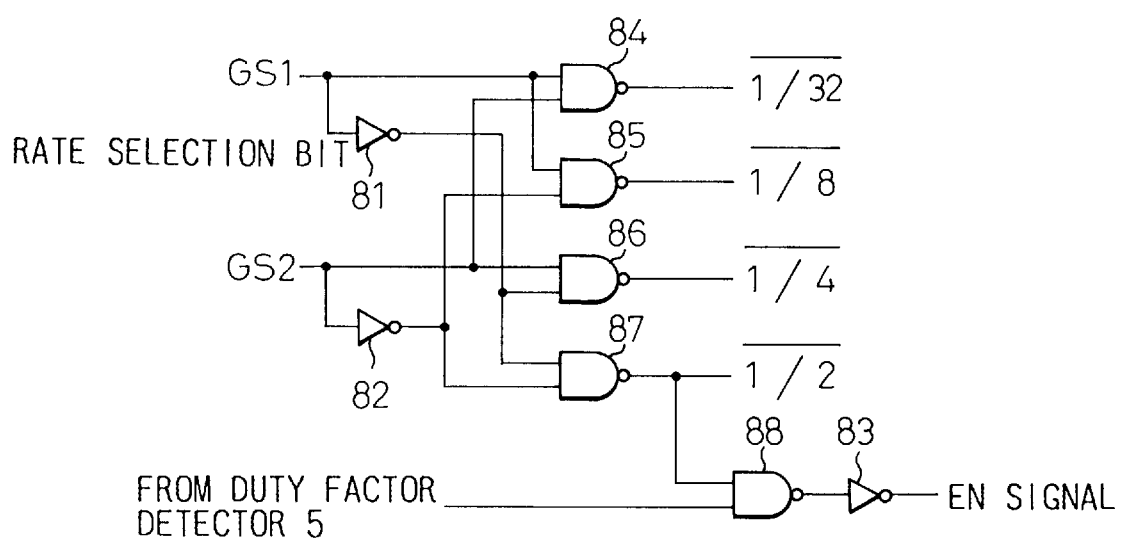
FIG. 19 is a circuit diagram showing a modification of the microcontroller system of FIG. 13.

FIG. 19 is a circuit diagram showing an essential part of a modification of the microcontroller system of FIG. 13. This modification has inverters 81 to 83 and NAND gates 84 to 88. An input terminal of the NAND gate 88 receives an output of the duty factor detector 5 of FIG. 13. Input terminals of each of the NAND gates 84 to 87 receive rate select bits GS1 and GS2 directly or inverted by the inverters 81 and 82. The NAND gates 84 to 87 provide rate select signals of inverted levels to specify rates of 1/32, 1/8, 1/4, 6 and 1/2, respectively. When the rate of 1/2 is selected, a signal EN from the inverter 83 becomes always 0, and the clock generator 1' provides a system clock signal A of the fixed duty factor.

Figure 20:
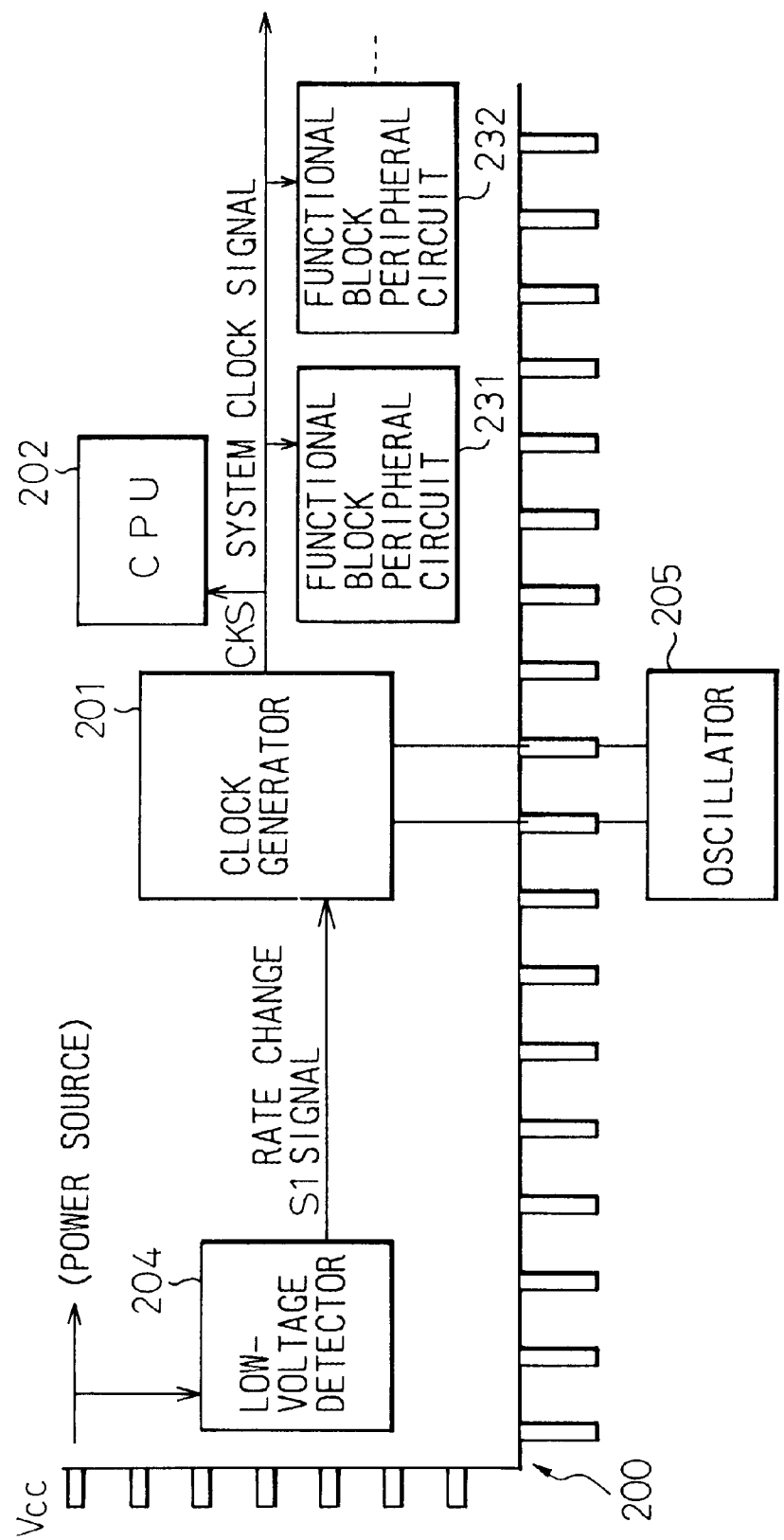
FIG. 20 is a block diagram showing a microcontroller system according to a third embodiment of the present invention.
Figure 21:
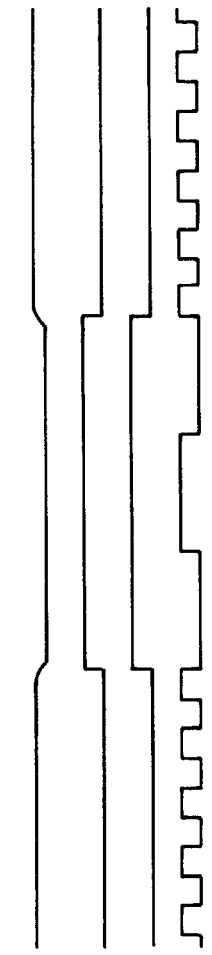
FIG. 21 is a timing chart explaining the operation of the microcontroller system of FIG. 20.

FIG. 20 is a block diagram showing a microcontroller system according to the third embodiment of the present invention. FIG. 21 is a timing chart explaining the operation of the microcontroller system of FIG. 20.

In FIG. 20, the microcontroller system (semiconductor integrated circuit device) has a clock generator (a system clock generator) 201, a CPU 202, functional blocks (peripheral circuits) 231 and 232, a low-voltage detector 204, and an oscillator 205. The low-voltage detector 204 provides a rate change instruction signal S1 to decelerate a system clock signal CKS, i.e., to decrease the frequency of the signal CKS.

The clock generator 201 supplies the system clock signal CKS. The frequency of the system clock signal CKS is determined by halving the frequency of the output of the oscillator 205 under a steady state. The low-voltage detector 204 is connected to a power source Vcc, to monitor the voltage of the power source Vcc. Under a steady state voltage, the instruction signal S1 to the clock generator 201 is at an inactive level.

When the power source voltage Vcc decreases as shown in FIG. 21, the low-voltage detector 204 detects it and activates the instruction signal S1. Consequently, the clock generator 201 changes the frequency of the system clock signal CKS by dividing the frequency of the output of the oscillator 205 by 16. This results in reducing power consumption of the microcontroller system and preventing a malfunction due to a delay in a circuit operation caused by a voltage drop.

When the power source voltage Vcc returns to a steady state level, the low-voltage detector 204 inactivates the instruction signal S1. Consequently, the clock generator 201 determines the frequency of the system clock signal CKS by halving the frequency of the output of the oscillator 205. As a result, a normal high-speed operation is resumed.

Figure 22:
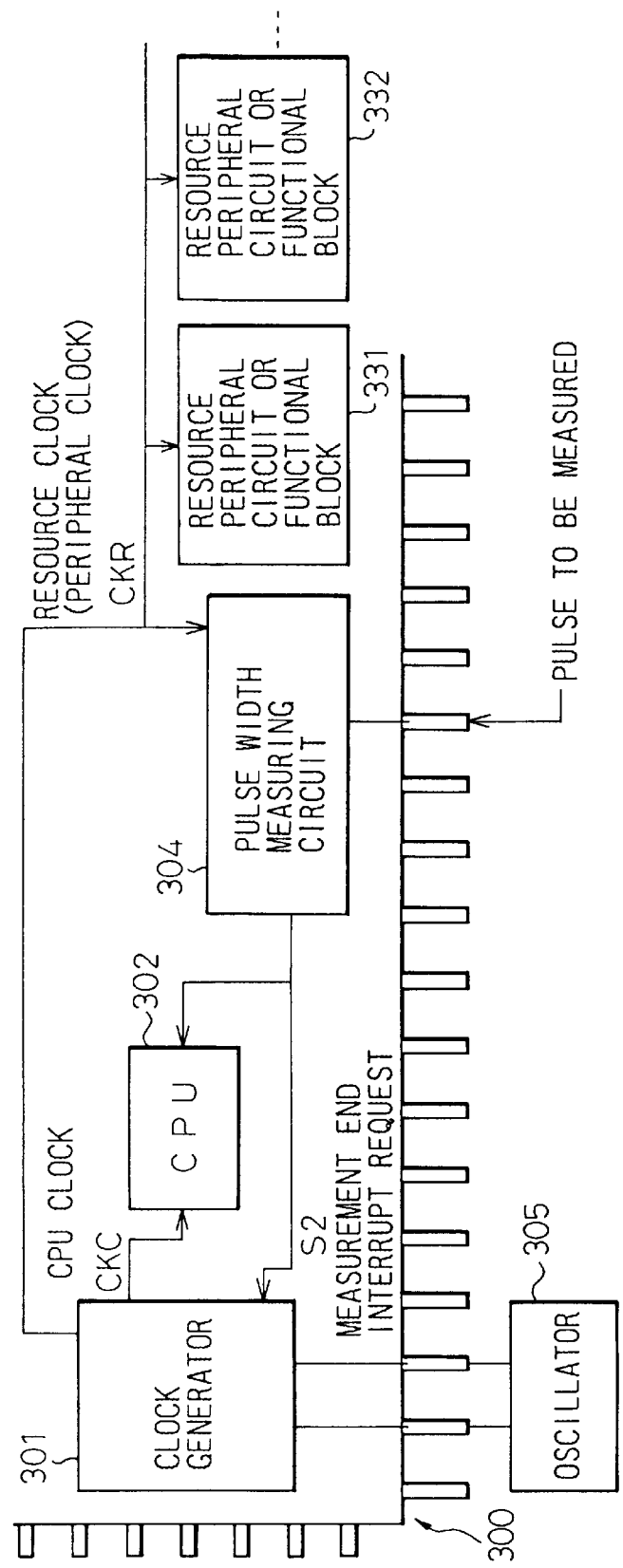
FIG. 22 is a block diagram showing a microcontroller system according to a fourth embodiment of the present invention.

FIG. 22 is a microcontroller system according to the fourth embodiment of the present invention, and FIG. 23 is a timing chart showing the operation of the system of FIG. 22.

In FIG. 22, the microcontroller system has a semiconductor integrated circuit device (LSI) 300, a clock generator (a system clock generator) 301, a CPU 302, resources (functional blocks or peripheral circuits) 331 and 332, a pulse width measurement circuit 304, and an oscillator 305. This embodiment increases the frequency of the clock signal in response to a measurement end interrupt request (S2) from the pulse width measurement circuit 304.

The clock generator 301 provides the CPU 302 with a CPU clock signal CKC, and the resources 331 and 332 with a resource clock signal CKR. As explained with reference to FIGS. 4 to 12, the frequencies of the clock signals CKC and CKR are independently determined. Under a steady state, the frequencies of these clock signals are determined by halving the frequency of the output of the oscillator 305.

The pulse width measurement circuit 304 operates in response to the resource clock signal CKR provided by the clock generator 301, to measure the width of an external pulse. The pulse width measurement circuit 304 provides the CPU 302 with the measurement end interrupt request S2 once the measurement is complete. The request S2 is also supplied to the clock generator 301 too. When the request S2 is active, the frequency of the CPU clock signal CKC is changed by halving the frequency of the output of the oscillator 305.

When a high-speed process request is not sent to the CPU 302 while the pulse width measurement circuit 304 is measuring the width of a pulse as shown in FIG. 23, the frequency of the CPU clock CKC is provided by dividing the frequency of the output of the oscillator 305 by 16. This reduces power consumption of the CPU 302. At this time, the resource clock signal CKR to the pulse width measurement circuit 304 is under a steady state, so that the circuit 304 may continue the measurement process.

Once the measurement circuit 304 completes the measurement, it provides the CPU 302 with the measurement end interrupt request S2. Then, the CPU 302 starts an interrupt process, and the clock generator 301 restores the frequency of the CPU clock signal CKC by halving the frequency of the output of the oscillator 305. As a result, the CPU 302 carries out the interrupt process at a high speed. When the interrupt process ends, the measurement end interrupt request S2 is withdrawn, and the CPU clock signal CKC rate may be again reduced.

As explained above in detail, the present invention provides a clock signal generator circuit capable of maintaining the general operation speed of a microcontroller system while minimizing power consumption of modules including the CPU of the system. The present invention secures a quick response from the system even when the CPU operates at a low speed. The present invention never operates the CPU at an unnecessarily high speed.

Many different embodiments of the present invention may be constructed without departing from the spirit and scope of the present invention, and it should be understood that the present invention is not limited to the specific embodiments described in this specification, except as defined in the appended claims.

What is claimed is:

1. A clock signal generator circuit for generating and supplying clock signals to a central processing unit and functional blocks, comprising:
    a clock generator for suppressing at least one active or inactive state of a source clock signal by calculating a logical result of an output of a counter and the source clock, to generate and provide a plurality of clock signals whose periods are integer multiples of a period of the source clock signal; and
    a plurality of clock selectors, provided for said central processing unit and said functional blocks, each selecting one clock signal of the clock signals generated by said clock generator and supplying to at least one of said central processing unit and said functional blocks.

2. A clock signal generator circuit as claimed in claim 1, wherein the period of the clock signal supplied to said central processing unit is longer than those of the clock signals supplied to said functional blocks, to reduce power consumption.

3. A microcontroller system comprising a central processing unit, functional blocks, and a clock generator for generating and supplying clock signals to said central processing unit and said functional blocks, wherein said clock generator suppresses at least one active or inactive state of a source clock signal by calculating a logical result of an output of a counter and the source clock, to optionally generate a plurality of clock signals whose periods are integer multiples of a period of the source clock signal, and supplying the generated clock signals to said central processing unit and said functional blocks through a plurality of clock selectors, and each of said clock selectors selects one clock signal of the clock signals generated by said clock generator.

4. A microcontroller system as claimed in claim 3, wherein said clock generator optionally extends or shortens the active or inactive state of the source clock signal, to generate clock signals each having an optional period.

5. A microcontroller system as claimed in claim 4, wherein the active or inactive state of the source clock signal is changeable only at a specific clock period and is fixed at any other clock period.

6. A microcontroller system comprising a central processing unit, functional blocks, a clock generator for generating and supplying a plurality of clock signals to said central processing unit and said functional blocks, and a voltage detector for providing a low- or high-voltage detected signal when a power source voltage is lower or higher than a predetermined value wherein said clock generator generates the source clock when the power source voltage is higher than the predetermined value and generates a frequency divided signal of the source clock when the power source voltage is lower than the predetermined value, without regard to said central processing unit and automatically controls the periods of the clock signals upon receiving the detected signal.

7. A microcontroller system as claimed in claim 6, wherein said clock generator automatically controls the periods of the clock signals in response to an external request.

8. A semiconductor integrated circuit device having a central processing unit, functional blocks, and a clock generator for generating and supplying clock signals to said central processing unit and said functional blocks, wherein said clock generator suppresses at least one active or inactive state of a source clock signal by calculating a logical result of an output of a counter and the source clock, to optionally generate a plurality of clock signals whose periods are integer multiples of a period of the source clock signal, and supplying the generated clock signals to said central processing unit and said functional blocks through a plurality of clock selectors, and each of said clock selectors selects one clock signal of the clock signals generated by said clock generator.

9. A semiconductor integrated circuit device as claimed in claim 8, wherein said clock generator optionally extends or shortens the active or inactive state of the source clock signal, to generate clock signals each having an optional period.

10. A semiconductor integrated circuit device as claimed in claim 9, wherein the active or inactive state of the source clock signal is changeable only at a specific clock period and is fixed at any other clock period.

11. A semiconductor integrated circuit device comprising a central processing unit, functional blocks, a clock generator for generating and supplying a plurality of clock signals to said central processing unit and said functional blocks, and a voltage detector for providing a low- or high-voltage detected signal when a power source voltage is lower or higher than a predetermined value wherein said clock generator generates the source clock when the power source voltage is higher than the predetermined value and generates a frequency divided signal of the source clock when the power source voltage is lower than the predetermined value, without regard to said central processing unit and automatically controls the periods of the clock signals upon receiving the detected signal.

12. A semiconductor integrated circuit device as claimed in claim 11, wherein said clock generator automatically controls the periods of the clock signals in response to an external request.

* * * * *

UNITED STATES PATENT AND TRADEMARK OFFICE
CERTIFICATE OF CORRECTION

PATENT NO. : 6,026,498

DATED : February 15, 2000

INVENTOR(S) : Fuse et al.

It is certified that error appears in the above-identified patent and that said Letters Patent is hereby corrected as shown below:

Title page, item [54]
and column 1, please delete "CLOCK SIGNAL GENERATOR CIRCUIT USING A LOGICAL RESULT OF AN OUTPUT OF A COMPUTER AND A SOURCE CLOCK TO GENERATE PLURALITY OF CLOCK SIGNALS", and insert --

CLOCK SIGNAL GENERATOR CIRCUIT USING A LOGICAL RESULT OF AN OUTPUT OF A COUNTER AND A SOURCE CLOCK TO GENERATE PLURALITY OF CLOCK SIGNALS --

Signed and Sealed this

Twenty-seventh Day of February, 2001

Attest:

NICHOLAS P. GODICI

*Attesting Officer*   *Acting Director of the United States Patent and Trademark Office*